United States Patent
Lo et al.

(10) Patent No.: US 12,395,190 B2
(45) Date of Patent: Aug. 19, 2025

(54) METHOD AND APPARATUS FOR LDPC CODE CONSTRUCTION IN COMMUNICATIONS

(71) Applicant: MediaTek Inc., Hsinchu (TW)

(72) Inventors: Chiaming Lo, San Jose, CA (US); Linfang Wang, San Jose, CA (US)

(73) Assignee: MediaTek Inc. (TW)

( * ) Notice: Subject to any disclaimer, the term of this patent is extended or adjusted under 35 U.S.C. 154(b) by 0 days.

(21) Appl. No.: 18/398,186

(22) Filed: Dec. 28, 2023

(65) Prior Publication Data

US 2025/0219660 A1    Jul. 3, 2025

(51) Int. Cl.
*H03M 13/11*     (2006.01)

(52) U.S. Cl.
CPC .............. *H03M 13/1177* (2013.01)

(58) Field of Classification Search
CPC .......... H03M 13/1177; H03M 13/116
See application file for complete search history.

(56) References Cited

U.S. PATENT DOCUMENTS

| | | | | |
|---|---|---|---|---|
| 2005/0289437 A1* | 12/2005 | Oh | ..................... | H03M 13/1185 714/758 |
| 2008/0077843 A1* | 3/2008 | Cho | ................... | H03M 13/6566 714/801 |
| 2009/0228771 A1* | 9/2009 | Shasha | ................ | H03M 13/1185 714/801 |
| 2018/0226989 A1* | 8/2018 | Soriaga | ................ | H03M 13/116 |

OTHER PUBLICATIONS

A. Kalsi, A. Bajpai, L. Wuttisittikulkij and P. Kovintaewat, "A base matrix method to construct col. weight 3 quasi-cyclic LDPC codes with high girth," 2016 International Conference on Electronics, Information, and Communications (ICEIC), Danang, Vietnam, 2016.*
European Patent Office, Extended European Search Report in European Patent Application No. 24151159.1, May 27, 2024.
Mitsubishi Electric Corporation: "Performance improvement of the rate-compatible LDPC codes", 3GPP TSG RAN WG1 #46 Meeting, R1-062240, Tallinn, Estonia, Aug. 28-Sep. 1, 2006.
Catt: "LDPC codes design for eMBB", 3GPP TSG RAN WG1 AH_NR Meeting, R1-1700237, Spokane, USA, Jan. 16-20, 2017.
Mediatek Inc.: "Compact QC-LDPC design", 3GPP TSG-RAN WG1 NR, R1-1703697, Athens, Greece, Feb. 13-17, 2017.

\* cited by examiner

*Primary Examiner* — Steve N Nguyen
(74) *Attorney, Agent, or Firm* — Andy M. Han; Han IP PLLC

(57) ABSTRACT

Various solutions for improving LDPC with respect to an apparatus in mobile communications are described. The apparatus may determine a first base matrix corresponding to a parity-check matrix of LDPC. The apparatus may determine a plurality of second base matrices based on the first base matrix by shifting a plurality of elements of the first base matrix along at least one of column-direction and row-direction, wherein a value of each element is one. The apparatus may determine the parity-check matrix according to the first base matrix and the second base matrices.

20 Claims, 13 Drawing Sheets

| $O_1$ | | | | | | | $P_1$ → | | |
|---|---|---|---|---|---|---|---|---|---|
| $I(1)$ | $I(2)$ | $I(3)$ | ⋯ | $I(K_b-1)$ | $I(K_b)$ | | | | |
| $I(1)+1$ | $I(2)+1$ | $I(3)+1$ | ⋯ | $I(K_b-1)+1$ | $I(K_b)+1$ | $Z-1$ | | | $Z-1$ |
| $I(1)+2$ | $I(2)+2$ | $I(3)+2$ | ⋯ | $I(K_b-1)+2$ | $I(K_b)+2$ | | 1 | 1 | |
| $I(1)+3$ | $I(2)+3$ | $I(3)+3$ | ⋯ | $I(K_b-1)+3$ | $I(K_b)+3$ | | 1 | 1 | |
| $I(1)+4$ | $I(2)+4$ | $I(3)+4$ | ⋯ | $I(K_b-1)+4$ | $I(K_b)+4$ | $I(K_b+1)+4$ | $I(K_b+2)+4$ | $I(K_b+3)+4$ | $I(K_b+4)+4$ |
| ⋮ | ⋮ | ⋮ | ⋮ | ⋮ | ⋮ | ⋮ | ⋮ | ⋮ | ⋮ |
| $I(1)+A$ | $I(2)+A$ | $I(3)+A$ | ⋯ | $I(K_b-1)+A$ | $I(K_b)+A$ | $I(K_b+1)+A$ | $I(K_b+2)+A$ | $I(K_b+3)+A$ | $I(K_b+4)+A$ |

FIG. 4

| $P_3$ | | | | | |
|---|---|---|---|---|---|
| 0 | 0 | 0 | 0 | ⋮ | 1 |
| ⋮ | ⋮ | ⋮ | ⋮ | ⋮ | ⋮ |
| 0 | 0 | 0 | 1 | ⋮ | 0 |
| 0 | 0 | 1 | 0 | ⋮ | 0 |
| 0 | 1 | 0 | 0 | ⋮ | 0 |
| 1 | 0 | 0 | 0 | ⋮ | 0 |

METHOD AND APPARATUS FOR LDPC CODE CONSTRUCTION IN COMMUNICATIONS

TECHNICAL FIELD

The present disclosure is generally related to communications and, more particularly, to Low-Density Parity-Check (LDPC) code construction with respect to apparatus in communications.

BACKGROUND

Unless otherwise indicated herein, approaches described in this section are not prior art to the claims listed below and are not admitted as prior art by inclusion in this section.

In $5^{th}$-generation (5G) New Radio (NR) mobile communications, LDPC is introduced in NR data channel. In general LDPC, a base matrix of 5G NR Quasi-Cyclic (QC) matrix is an identify matrix, and the QC cyclic shift is one direction along the row-direction of the Identify matrix. For improving the efficiency of performing LDPC, different base matrices and cyclic shifts may be introduced.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

An objective of the present disclosure is to propose solutions or schemes that improving LDPC performance with respect to apparatus in communications.

In one aspect, a method may involve an apparatus determining a first base matrix corresponding to a parity-check matrix of LDPC. The method may also involve the apparatus determining a plurality of second base matrices based on the first base matrix by shifting a plurality of elements of the first base matrix along at least one of column-direction and row-direction, wherein a value of each element is one. The method may also involve determining the parity-check matrix according to the first base matrix and the second base matrices.

In one aspect, an apparatus may comprise a transceiver which, during operation, wirelessly communicates with at least one network node of a wireless network. The apparatus may also comprise a processor communicatively coupled to the transceiver. The processor, during operation, may perform operations comprising determining a first base matrix corresponding to a parity-check matrix of LDPC. The processor may also perform operations comprising determining a plurality of second base matrices based on the first base matrix by shifting a plurality of elements of the first base matrix along at least one of column-direction and row-direction, wherein a value of each element is one. The processor may also perform operations comprising determining the parity-check matrix according to the first base matrix and the second base matrices.

It is noteworthy that, although description provided herein may be in the context of certain radio access technologies, networks and network topologies such as Long-Term Evolution (LTE), LTE-Advanced, LTE-Advanced Pro, 5th Generation (5G), New Radio (NR), Internet-of-Things (IoT) and Narrow Band Internet of Things (NB-IoT), Industrial Internet of Things (IIoT), and 6th Generation (6G), the proposed concepts, schemes and any variation(s)/derivative(s) thereof may be implemented in, for and by other types of radio access technologies, networks and network topologies. Thus, the scope of the present disclosure is not limited to the examples described herein.

BRIEF DESCRIPTION OF THE DRAWINGS

The accompanying drawings are included to provide a further understanding of the disclosure and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

FIG. 4 is a diagram depicting an example scenario under schemes in accordance with implementations of the present disclosure.

FIG. 6 is a diagram depicting an example scenario under schemes in accordance with implementations of the present disclosure.

FIGS. 7 to 10 are diagrams depicting an example scenario under schemes in accordance with implementations of the present disclosure.

DETAILED DESCRIPTION OF PREFERRED IMPLEMENTATIONS

Detailed embodiments and implementations of the claimed subject matters are disclosed herein. However, it shall be understood that the disclosed embodiments and implementations are merely illustrative of the claimed subject matters which may be embodied in various forms. The present disclosure may, however, be embodied in many different forms and should not be construed as limited to the exemplary embodiments and implementations set forth herein. Rather, these exemplary embodiments and implementations are provided so that description of the present disclosure is thorough and complete and will fully convey the scope of the present disclosure to those skilled in the art. In the description below, details of well-known features and techniques may be omitted to avoid unnecessarily obscuring the presented embodiments and implementations.

Overview

Implementations in accordance with the present disclosure relate to various techniques, methods, schemes and/or solutions pertaining to improvement of LDPC with respect to apparatus in communications. According to the present disclosure, a number of possible solutions may be implemented separately or jointly. That is, although these possible solutions may be described below separately, two or more of these possible solutions may be implemented in one combination or another.

Regarding to LDPC code construction of the present disclosure, a first base matrix needs to be determined first. Based on the first base matrix, a plurality of second base matrices are determined by cyclically shifting the elements of the first base matrix along at least one of column-direction and row-direction. After determining the second base matrices, a parity-check matrix used in LDPC code construction (i.e., matrix H of LDPC code) can be determined by the second base matrices.

Figure 1:
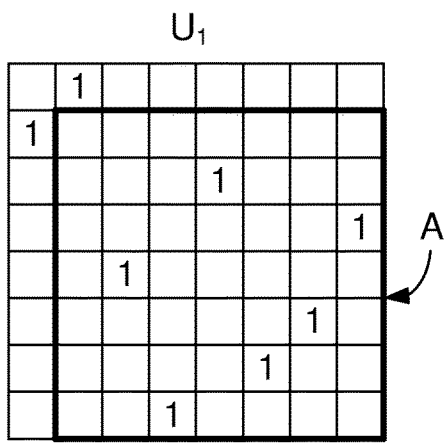
FIG. 1 is a diagram depicting an example scenario under schemes in accordance with implementations of the present disclosure.
Figure 2A:
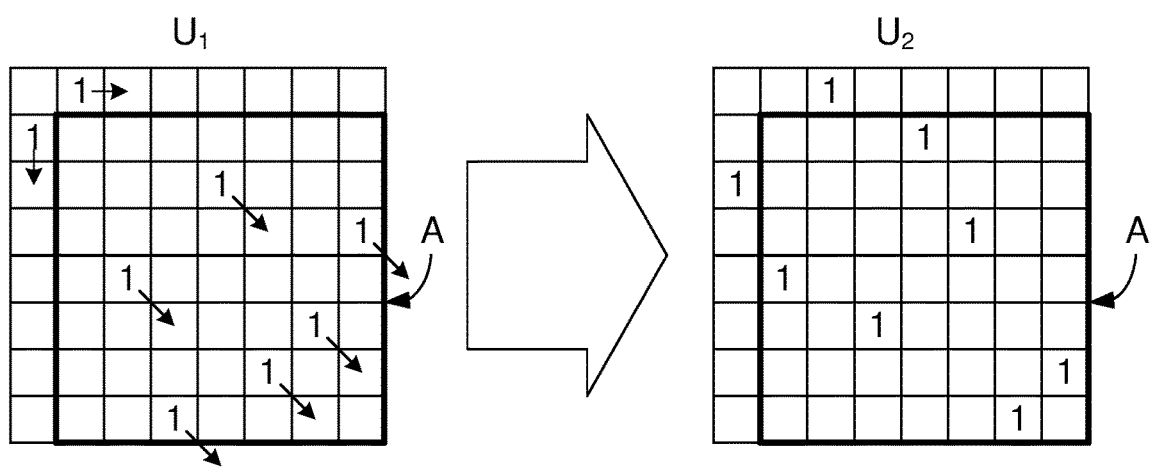
FIGS. 2A to 2F are diagrams depicting an example scenario under schemes in accordance with implementations of the present disclosure.
Figure 2B:
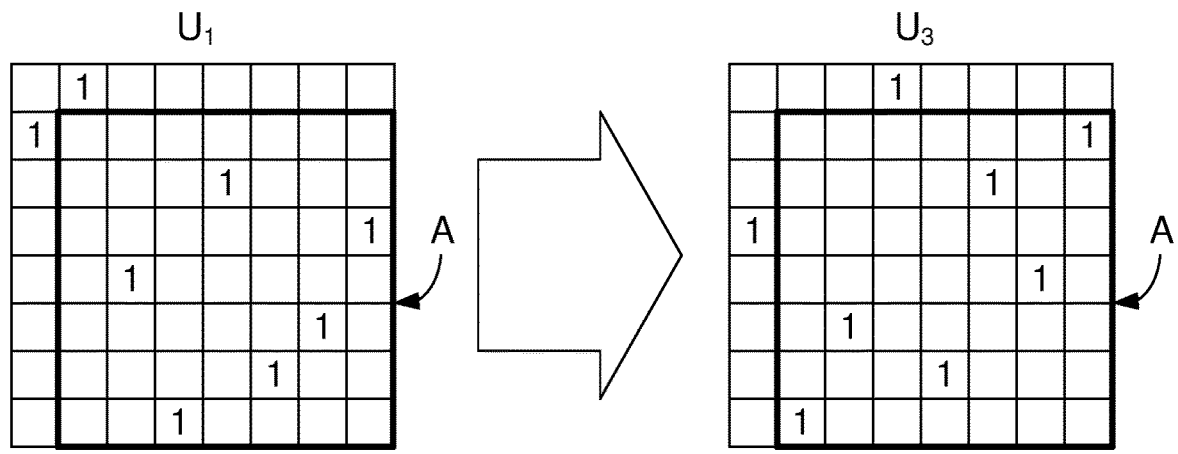
Figure 2C:
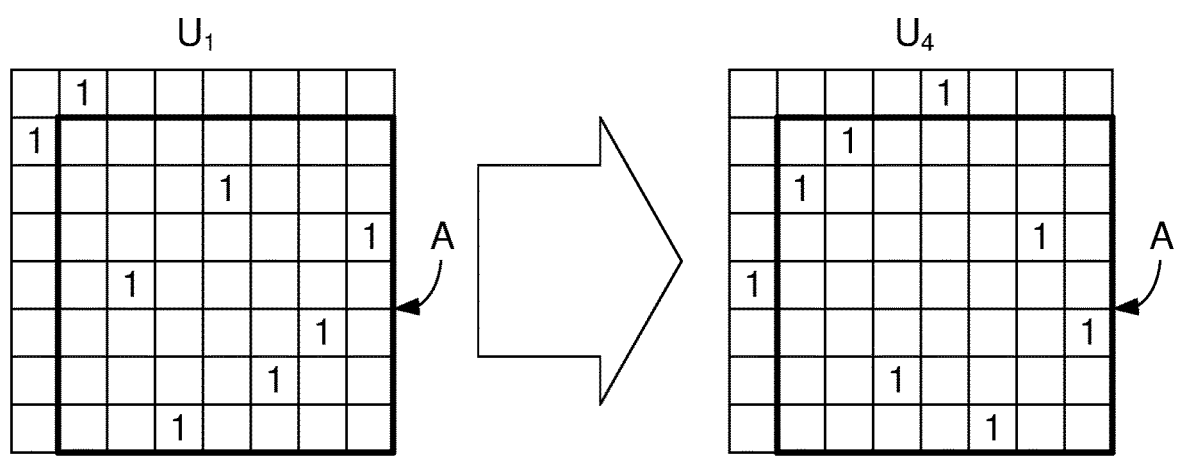
Figure 2D:
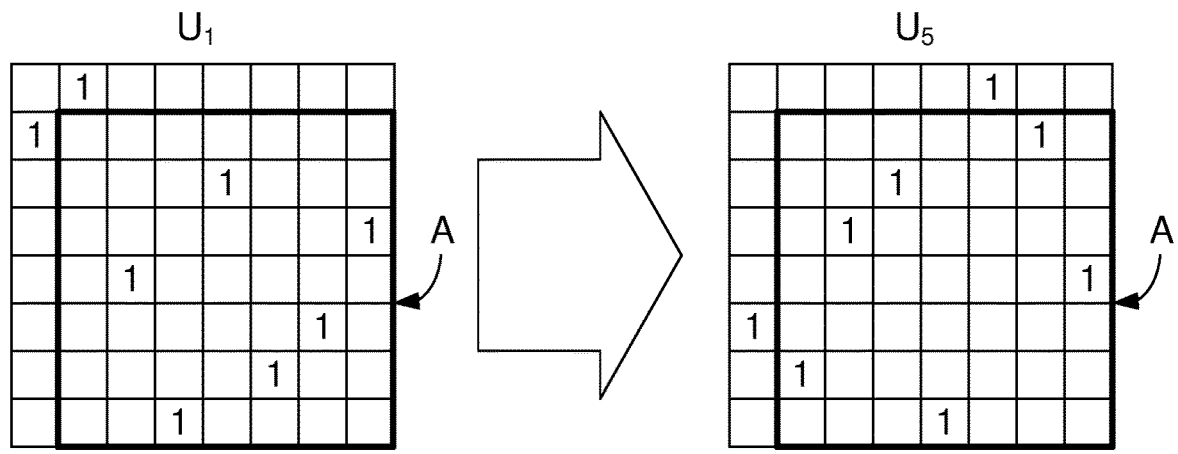
Figure 2E:
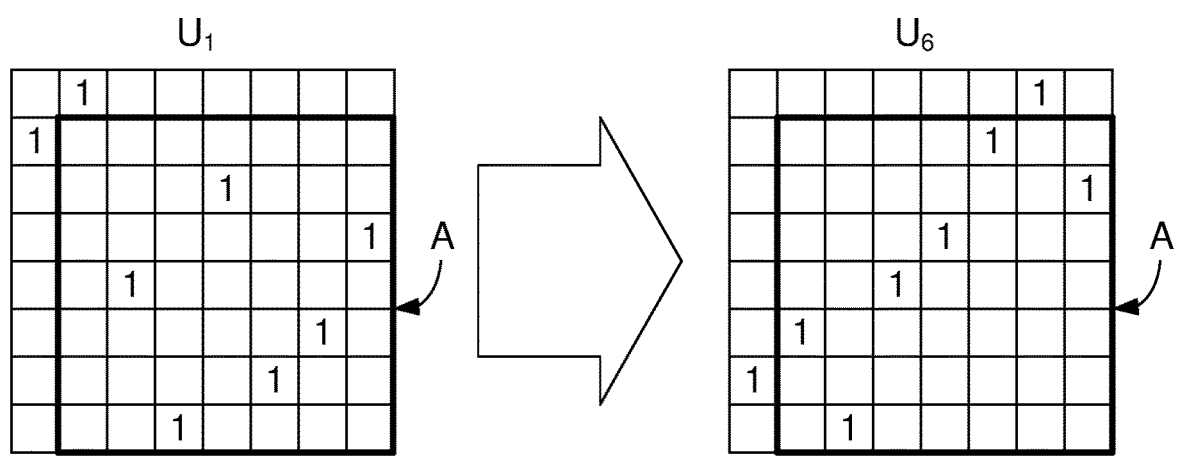
Figure 2F:
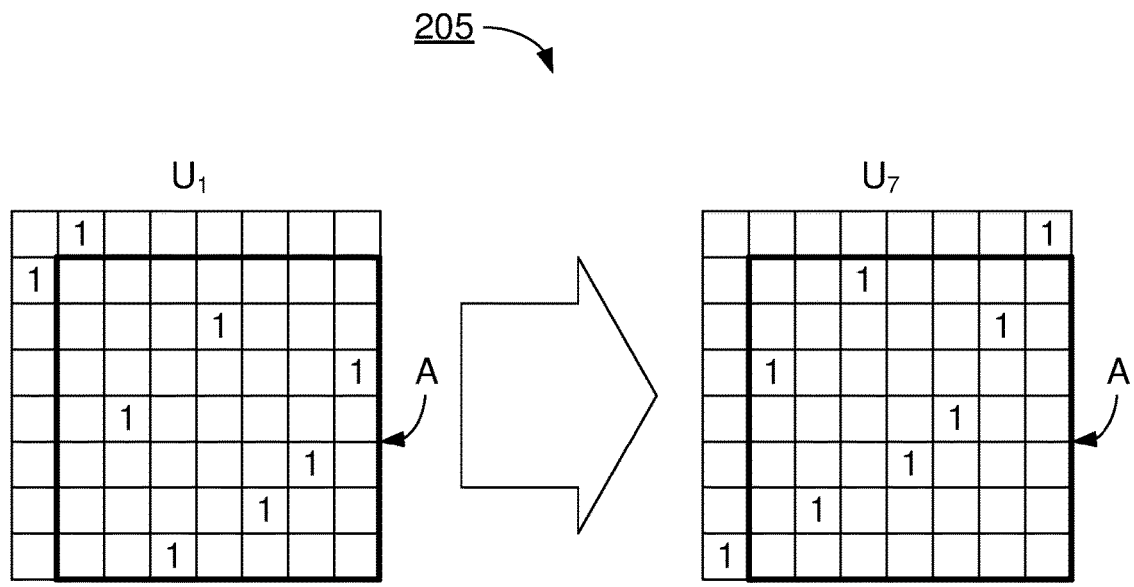

FIG. 1 illustrates an example scenario 100 for LDPC code construction in accordance with an implementation of the present disclosure. Scenario 100 illustrates a first base matrix $U_1$, which is determined by an apparatus, associated with a parity-check matrix H of LDPC code. The apparatus may be a part of a wireless communication network (e.g., an LTE network, a 5G/NR network, an IoT network or a 6G network).

It should be noted that the size of the first base matrix $U_1$ is Z by Z, and Z is 8 in the implementation. The first base matrix $U_1$ has Z elements while a value of each element is 1 and (0, 0) of the first base matrix $U_1$ is set to be empty or 0. In other words, (0, 0) of the first base matrix $U_1$ cannot be filled value 1. However, it is not intended to limit the value of Z which may preferably be 2 to power of n, while n is an integer, e.g. 3, 4, 5, etc.

In some implementations, the number of the second base matrices is Z–2, and the second base matrix $U_i$ is determined based on the following rules:
(1) the element within the first row of the first base matrix $U_1$ is shifted (i–1) position rightward along the row-direction while i is index of the second base matrix $U_i$, and the element is cyclically shifted within the first row and bypasses position (0, 0) if the column of the element is greater than Z;
(2) the element within the first column of the first base matrix $U_1$ is shifted (i–1) position downward along the column-direction while i is index of the second base matrix $U_i$, and the element is cyclically shifted within the first column and bypasses position (0, 0) if the row of the element is greater than Z; and
(3) each of the elements outside the first row and the first column of the first base matrix $U_1$ is shifted (i–1) position rightward along the row-direction and shifted (i–1) position downward along the column-direction while i is index of the second base matrix $U_i$, and the element is cyclically shifted within an area A if the row or the column of the element is greater than Z.

In other words, the second base matrix $U_1$ is determined based on the first base matrix $U_1$ (which has rows from 0 to Z–1 and columns from 0 to Z–1) by:
(1) shifting the element (0, y) of a first row of the first base matrix $U_1$ to (0, ((y+i–2) % (Z–1))+1), i.e., shifting the element (0, y) to (0, y+1) repeatedly within (0, k), k=2:Z–1
(2) shifting the element (x, 0) of a first column of the first base matrix $U_1$ to (((x+i–2) % (Z–1))+1, 0), i.e., shifting the element (x, 0) to (x+1, 0) repeatedly within (k, 0), k=2:Z–1, and
(3) shifting the elements (x, y) of the first base matrix $U_1$ outside the first row and the first column of the first base matrix to ((x+i–1) % (Z–1), (y+i–1) % (Z–1)).

FIGS. 2A to 2F illustrate example scenarios 200 to 205 for LDPC code construction in accordance with an implementation of the present disclosure. Scenarios 200 to 205 respectively illustrate the determinations of the second base matrices $U_2$ to $U_7$, which are determined by the apparatus, from the first base matrix $U_1$ based on the mentioned rules.

Figure 3:
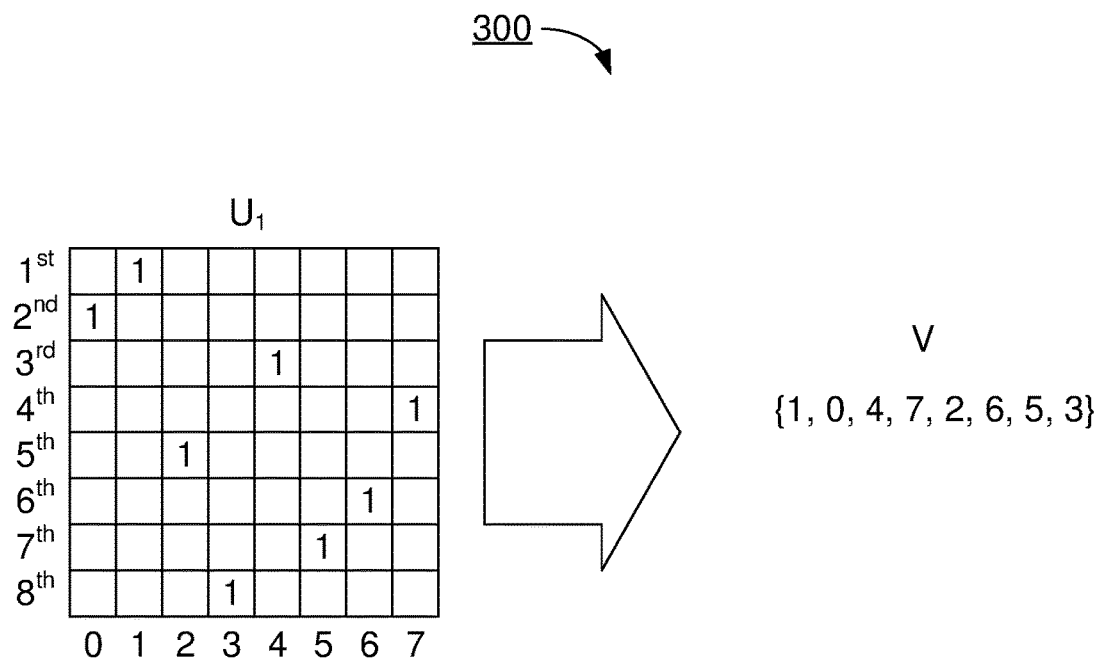
FIG. 3 is a diagram depicting an example scenario under schemes in accordance with implementations of the present disclosure.

FIG. 3 illustrates an example scenario 300 for LDPC code construction in accordance with an implementation of the present disclosure. Scenario 300 illustrates a transformation from the first base matrix $U_1$ to a vector V. In particular, each row of the first base matrix $U_1$ has Z positions which are labeled from 0 to 7. The vector V has Z elements, and $i^{th}$ element of the vector V is the labeled position where 1 is of $i^{th}$ row of the first base matrix $U_1$. For example, in the $1^{st}$ row of the first base matrix $U_1$, 1 is at position 1. Therefore, the $1^{st}$ element of the vector V is 1. In the $2^{nd}$ row of the first base matrix $U_1$, 1 is at position 0. Therefore, the $2^{nd}$ element of the vector V is 0. In the $3^{rd}$ row of the first base matrix $U_1$, 1 is at position 4. Therefore, the $3^{rd}$ element of the vector V is 4. Accordingly, the vector V of the first base matrix $U_1$ is {1, 0, 4, 7, 2, 6, 5, 3}. Further, based on the transformation from matrix to vector, the second base matrices $U_2$ to $U_7$ can be respectively transformed to vectors {2, 4, 0, 5, 1, 3, 7, 6}, {3, 7, 5, 0, 6, 2, 4, 1}, {4, 2, 1, 6, 0, 7, 3, 5}, {5, 6, 3, 2, 7, 0, 1, 4}, {6, 5, 7, 4, 3, 1, 0, 2}, {7, 3, 6, 1, 5, 4, 2, 0}.

In some implementations, for a given Z, a base vector $V_1$ derived from a Z by Z base matrix $U_1$ may be expressed as $\{1, 0, x_1, x_2, \ldots x_{Z-2}\}$ while $x_1, x_2, \ldots x_{Z-2}$ are distinct and belong [2:Z–1]. When z=Z–1, Base vector $V_2$ to $V_z$ are:

$$V_2 = \{2, (1+x_{Z-1}) \% z, 0, (1+x_1) \% z, (1+x_2) \% z, \ldots (1+X_{Z-1}) \% z\}$$

$$V_z = \{z, (z-1+x_1) \% z, (z-1+x_2) \% z, (z-1+x_3) \% z, \ldots (z-1+x_{Z-1}) \% z, 0\}.$$

In some implementations, a parity-check matrix H of LDPC code is determined by the second base matrices $U_2$ to $U_7$. In these implementations, the parity-check matrix H is composed of $U_2$ to $U_6$ by $$\begin{bmatrix} U_2 & U_3 & U_4 \\ U_3 & U_4 & U_5 \\ U_4 & U_5 & U_6 \end{bmatrix}.$$

In some implementations, the parity-check matrix H can be represented as $$\begin{bmatrix} 2 & 3 & 4 \\ 3 & 4 & 5 \\ 4 & 5 & 6 \end{bmatrix}$$

while the index i stands for the second base matrix $U_i$.

In some implementations, an ordered index matrix, a mask matrix and a parity matrix are determined for constructing the parity-check matrix H of LDPC code.

FIG. 4 illustrates an ordered index matrix $O_1$ determined by the second base matrices $U_2$ to $U_{Z-1}$. In particular, the size of the ordered index matrix $O_1$ is $M_b$ by ($K_b$+4). $M_b$ is the number of rows of the parity check matrix H, and Mb+Kb is the number of columns of the parity check matrix H, $M_b \times Z$ is the number of parity check bits, $K_b \times Z$ is the number of information bits. In the ordered index matrix $O_1$, A is $(M_b-1)$ and I is an index matching function fulfilled the following condition: when i is not equal to j, then I(i) is not equal to I(j). For example, the index matching function I(i)=i+1 so that I(1)=2, I(2)=3, I(3)=4, and so on. For another example, the index matching function I(i) fulfills: i=1: S, S<Z-3, a subset of {2:Z-2}, e.g., I(1)=37, I(2)=55, I(3)=80, and so on. The index value determined by the index matching function I stands for the second base matrix $U_i$. The ordered index matrix $O_1$ includes a 4 by 4 parity matrix $P_1$ at upper right corner, and the parity matrix $P_1$ includes elements of Z-1 and 1 as shown in FIG. 4.

Figure 5:
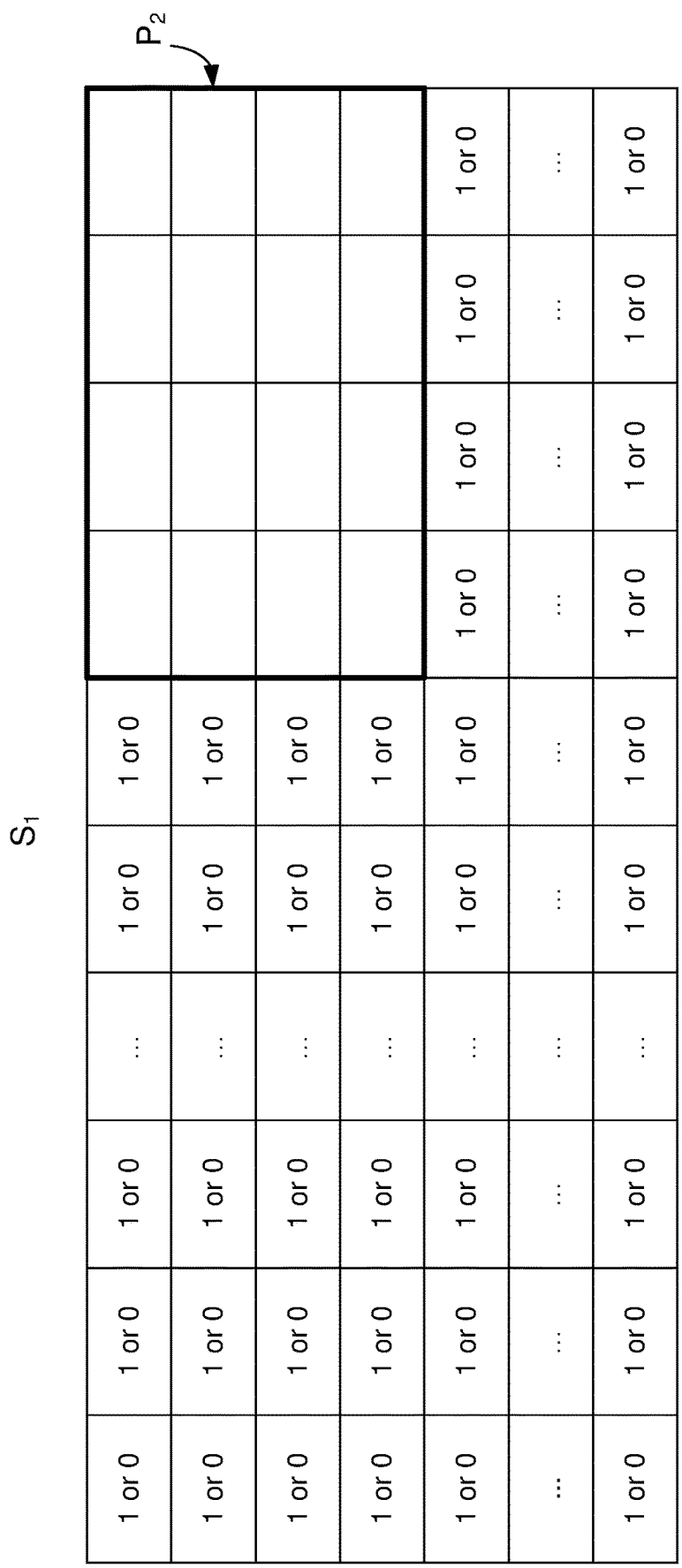
FIG. 5 is a diagram depicting an example scenario under schemes in accordance with implementations of the present disclosure.
Figure 6:
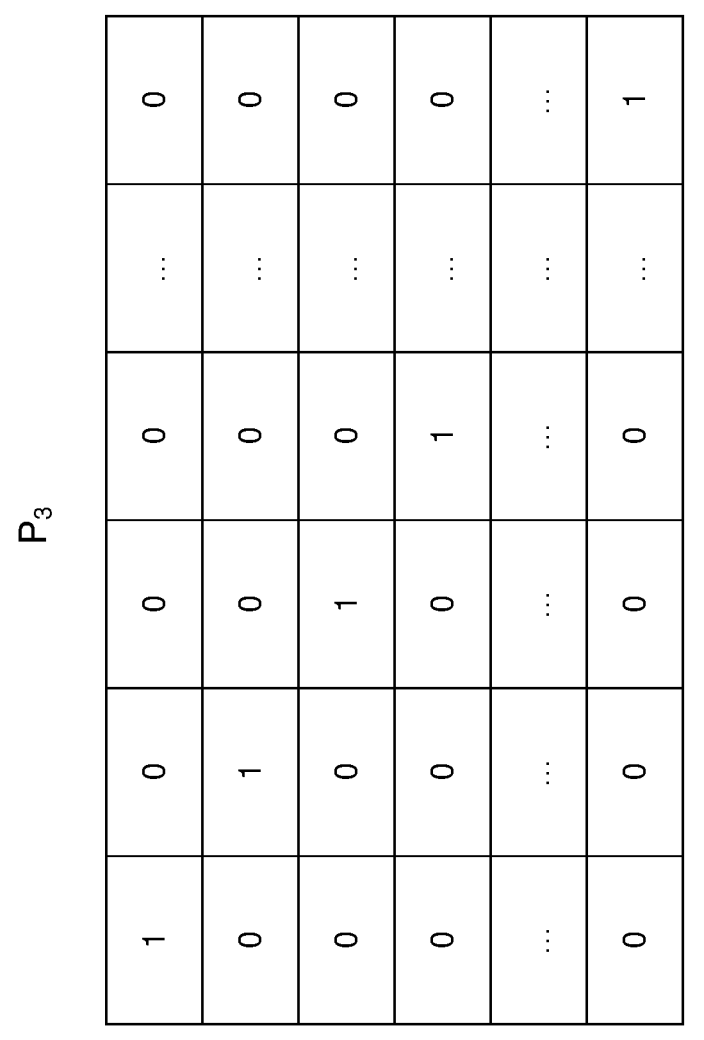

FIG. 5 illustrates a mask matrix $S_1$. The size of the mask matrix $S_1$ is $M_b$ by $(K_b+4)$. The mask matrix $S_1$ includes a 4 by 4 parity matrix $P_2$ at upper right corner. In the mask matrix $S_1$ exclusive the parity matrix $P_2$, each element is 1 or 0. The parity matrix $P_2$ is empty as shown in FIG. 5. FIG. 6 illustrates a parity matrix $P_3$. The size of the parity matrix $P_3$ is $(M_b-4)$ by $(M_b-4)$, and the parity matrix is an identity matrix.

In some implementations, the parity-check matrix H of LDPC code is determined according to the ordered index matrix $O_1$, the mask matrix $S_1$ and the parity matrix $P_3$. In particular, the parity-check matrix H of LDPC code is determined by: (1) masking the ordered index matrix $O_1$ by the mask matrix $S_1$, more specifically, a 0 in $S_1$ empty the $U_i$ at the corresponding $O_1$ matrix location; and then (2) determining the parity-check matrix H by combining the ordered index matrix $O_1$ with the parity matrix $P_3$.

Figure 7:
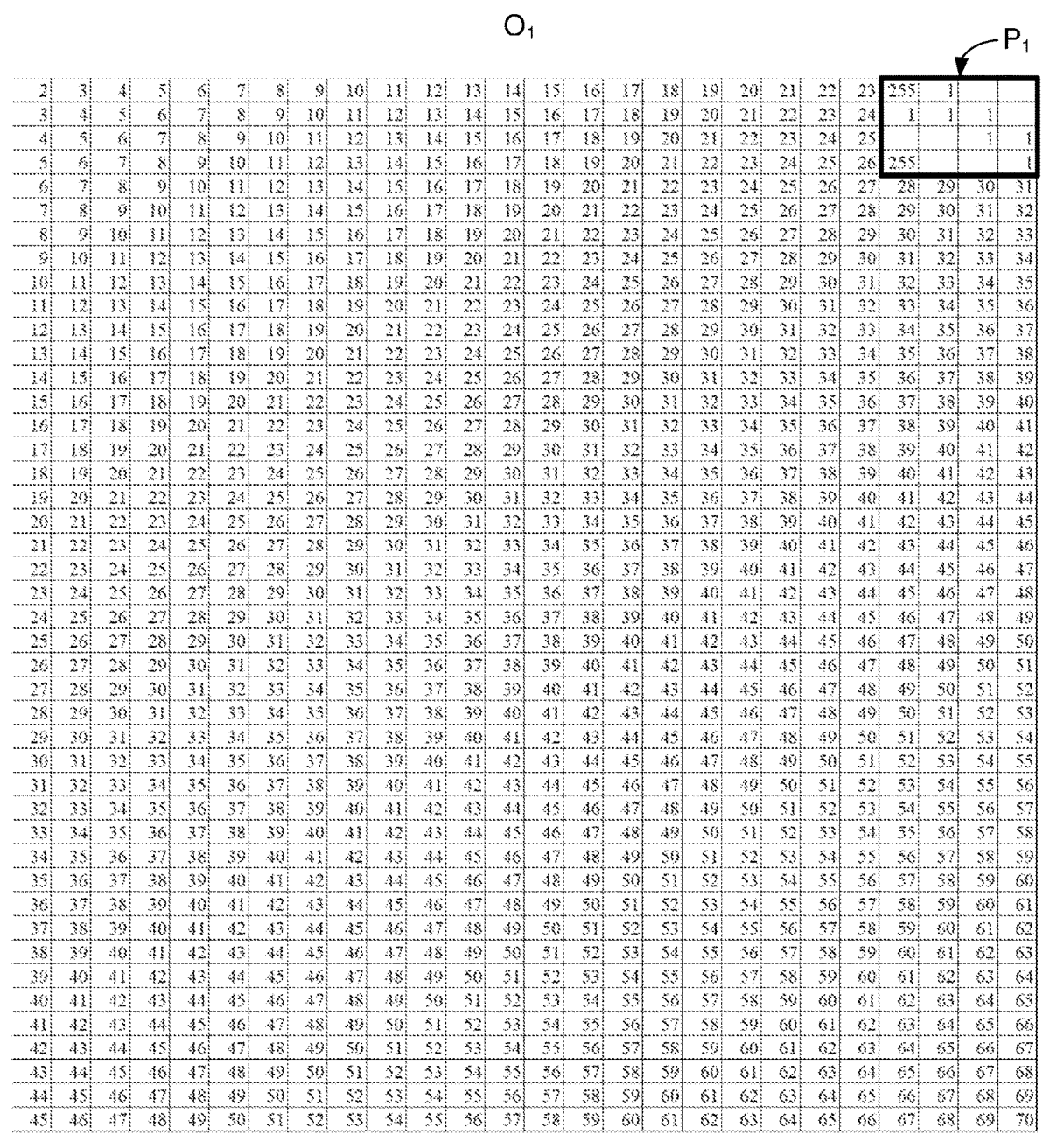
Figure 8:
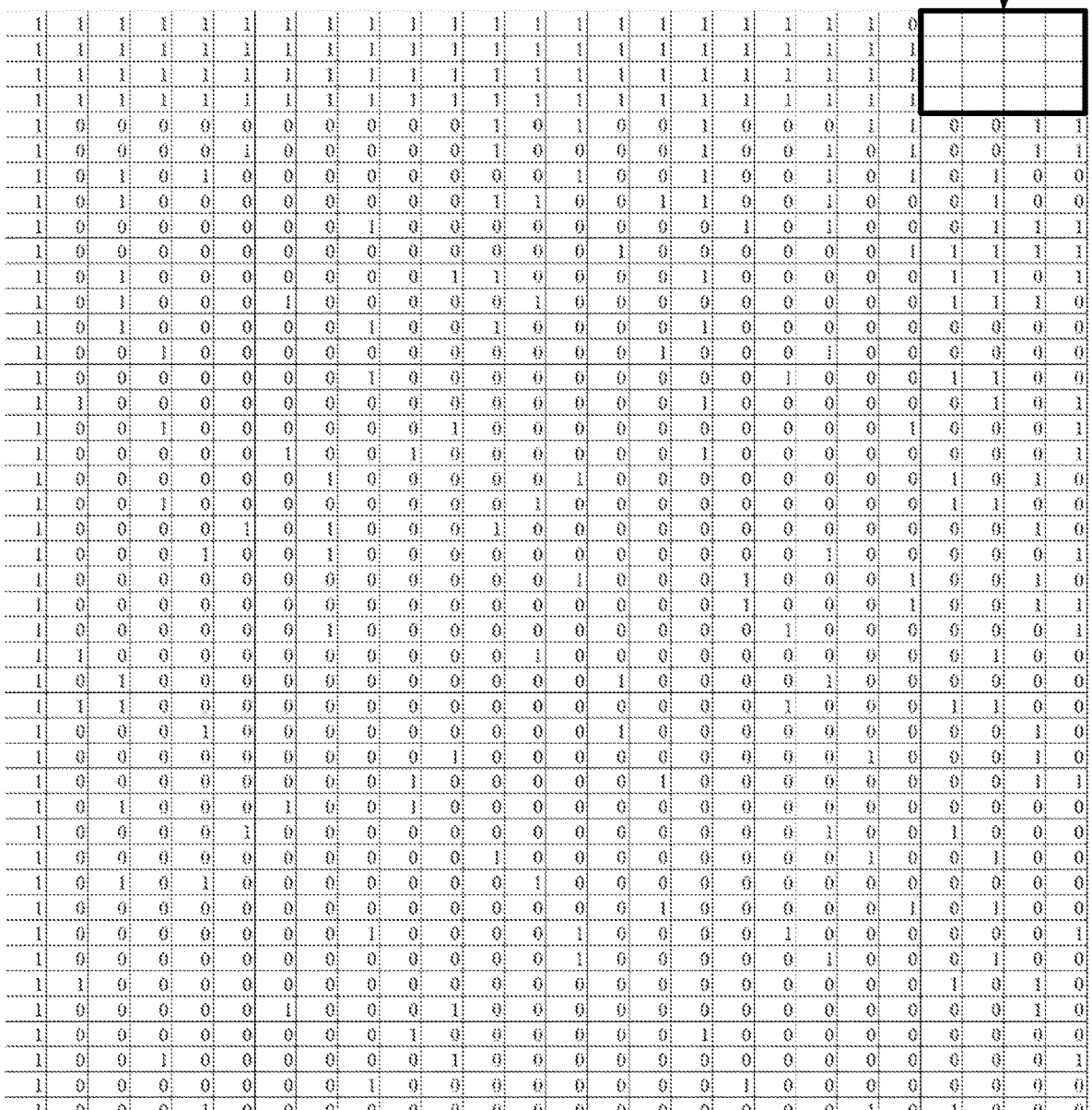

For example, examples of matrices of determining the parity-check matrix H of LDPC code are illustrated in FIGS. 7 to 10. In particular, when $K_b$ is 22, $M_b$ is 44 and Z is 256: (1) there are second base matrices $U_2$ to $U_{255}$, (2) the sizes of the ordered index matrix $O_1$ and the mask matrix $S_1$ are 44 by 26, and (3) the parity matrix $P_3$ is 40 by 40. The example of the ordered index matrix $O_1$ is shown in FIG. 7. The example of the mask matrix $S_1$ is shown in FIG. 8.

Figure 9:
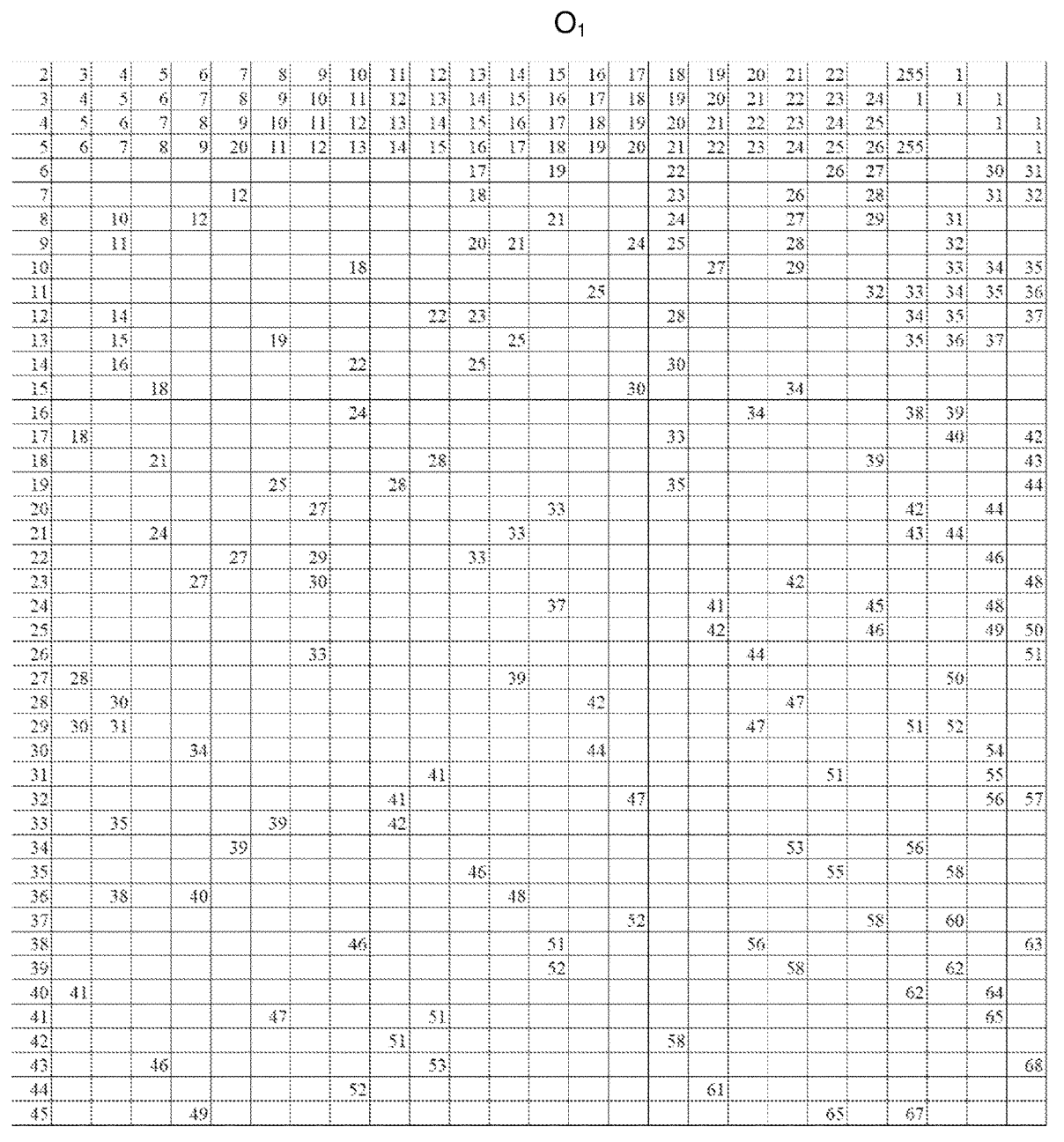

When masking the ordered index matrix $O_1$ by the mask matrix $S_1$: (1) the element of the ordered index matrix $O_1$ remains if the corresponding element of the mask matrix $S_1$ is 1; and (2) the element of the ordered index matrix $O_1$ become empty if the corresponding element of the mask matrix $S_1$ is 0. Then, the ordered index matrix $O_1$ is masked as shown in FIG. 9.

Figure 10:
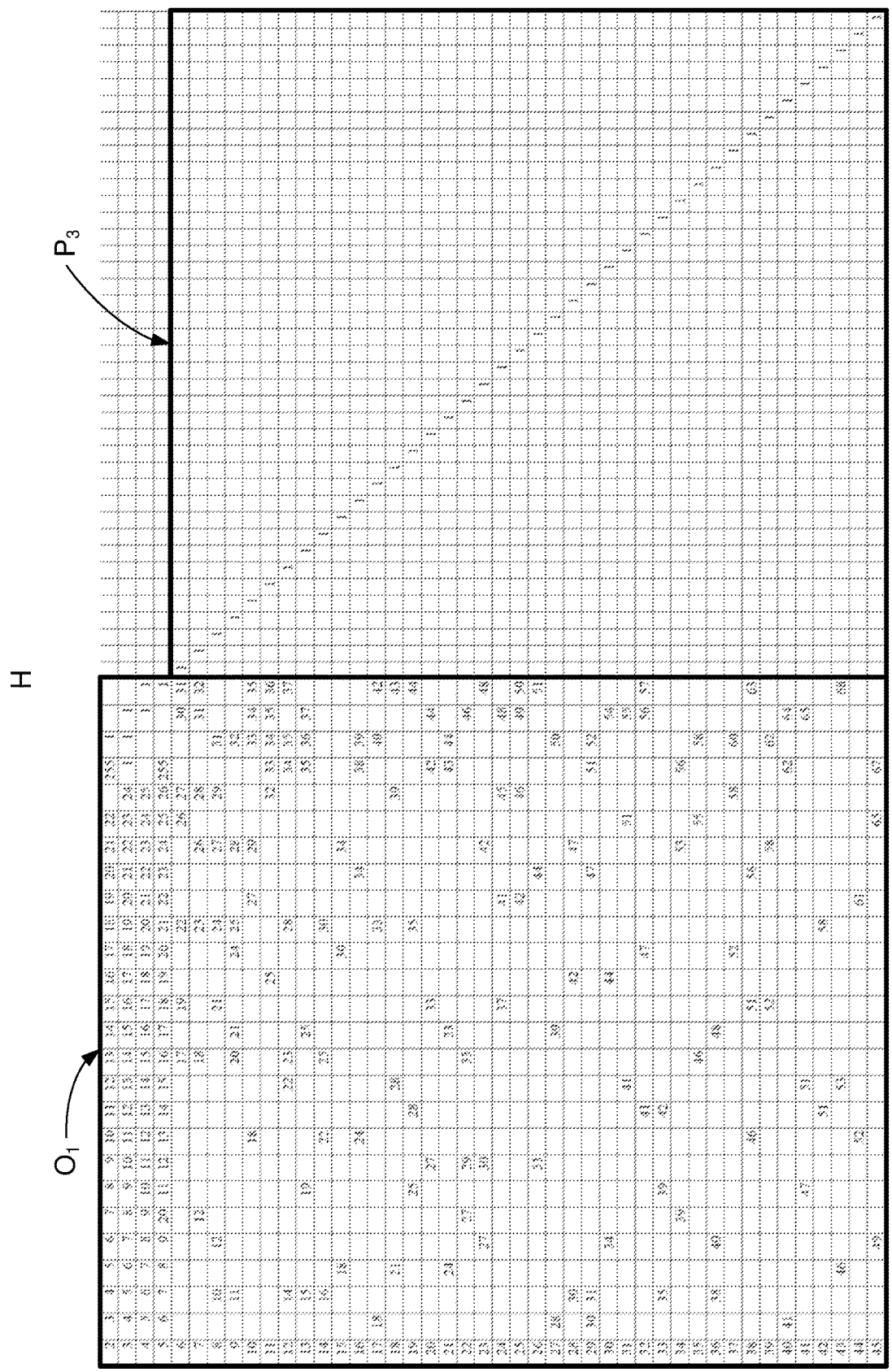

Next, the ordered index matrix $O_1$, which is masked by the mask matrix $S_1$, is combined with the parity matrix $P_3$ as shown in FIG. 10 to become the parity-check matrix H of LDPC code. The parity matrix $P_3$ is at the right lower corner of the parity-check matrix H, and the size of the parity-check matrix H is 44 by 66.

In some implementations, after determining the parity-check matrix H of LDPC code, the apparatus can: (1) encode a message by the parity-check matrix H, and transmit the message to a network; and/or (2) receive a message from a network, and decode the message by the parity-check matrix H.

In some implementations, an LDPC code length corresponding to the parity-check matrix H is $(K_b+M_b-p) \times Z$, an LDPC code rate corresponding to the parity-check matrix H is $K_b/(K_b+M_b-p)$ while p is a number of punctured Z.

Illustrative Implementations

Figure 11:
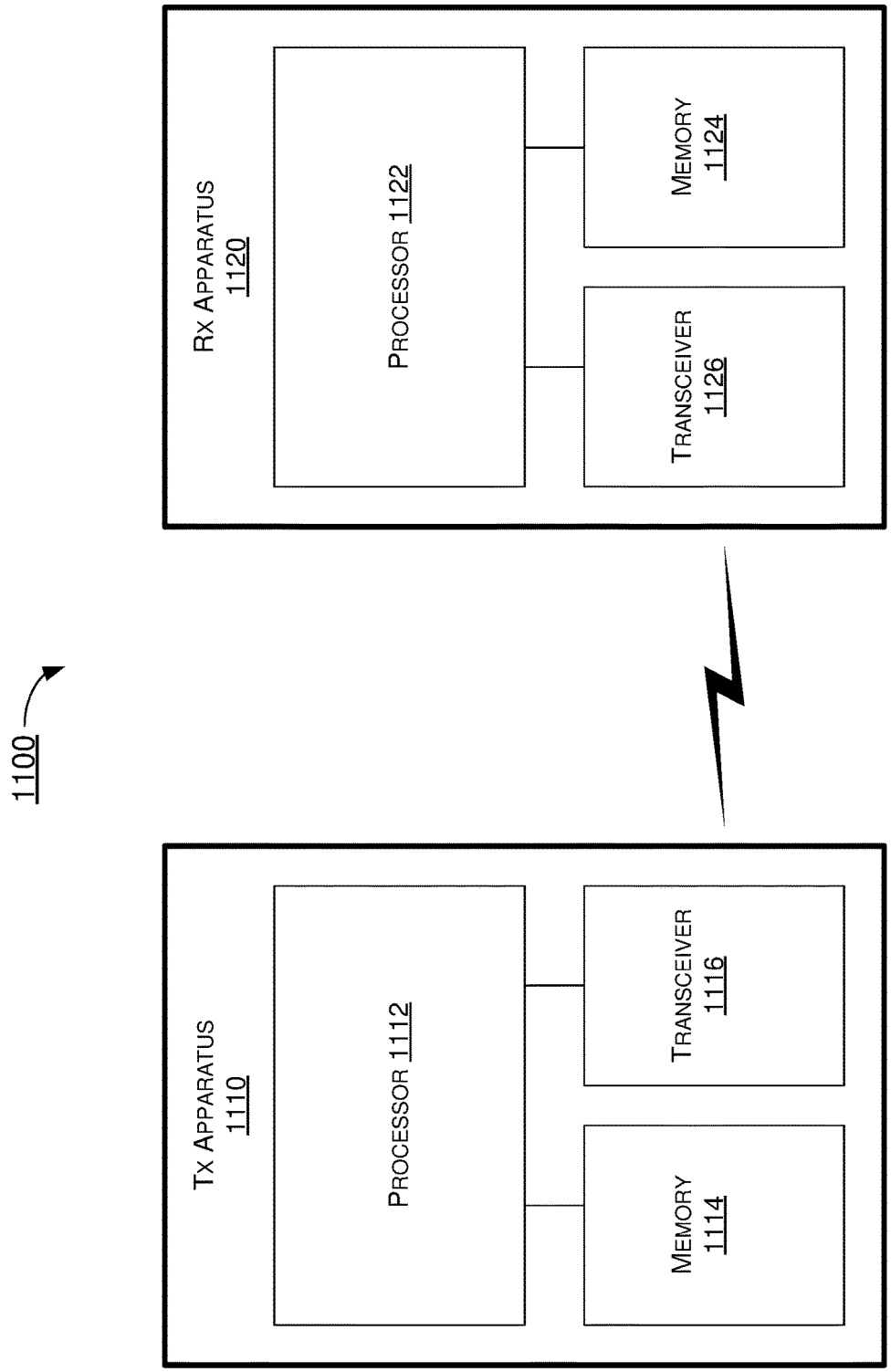
FIG. 11 is a block diagram of an example communication system in accordance with an implementation of the present disclosure.

FIG. 11 illustrates an example communication system 1100 having an example Tx apparatus 1110 and an example Rx apparatus 1120 in accordance with an implementation of the present disclosure. Each of Tx apparatus 1110 and Rx apparatus 1120 may perform various functions to implement schemes, techniques, processes and methods described herein pertaining to improvement of LDPC in communications, including scenarios/schemes described above as well as process 1200 described below.

Tx apparatus 1110 may be a part of an electronic apparatus such as a portable or mobile apparatus, a wearable apparatus, a wireless communication apparatus or a computing apparatus. For instance, Tx apparatus 1110 may be implemented in a smartphone, a smartwatch, a personal digital assistant, a digital camera, memory device like flash drive, high speed data center communication or a computing equipment such as a tablet computer, a laptop computer or a notebook computer. Tx apparatus 1110 may also be a part of a machine type apparatus, which may be an IoT, NB-IoT, or IIoT apparatus such as an immobile or a stationary apparatus, a home apparatus, a wire communication apparatus or a computing apparatus. For instance, Tx apparatus 1110 may be implemented in a smart thermostat, a smart fridge, a smart door lock, a wireless speaker or a home control center. Alternatively, Tx apparatus 1110 may be implemented in the form of one or more integrated-circuit (IC) chips such as, for example and without limitation, one or more single-core processors, one or more multi-core processors, one or more reduced-instruction set computing (RISC) processors, or one or more complex-instruction-set-computing (CISC) processors. Tx apparatus 1110 may include at least some of those components shown in FIG. 11 such as a processor 1112, for example. Tx apparatus 1110 may further include one or more other components not pertinent to the proposed scheme of the present disclosure (e.g., internal power supply, display device and/or user interface device), and, thus, such component(s) of Tx apparatus 1110 are neither shown in FIG. 11 nor described below in the interest of simplicity and brevity.

Rx apparatus 1120 may be a part of an electronic apparatus such as a portable or mobile apparatus, a wearable apparatus, a wireless communication apparatus or a computing apparatus. For instance, Rx apparatus 1120 may be implemented in a smartphone, a smartwatch, a personal digital assistant, a digital camera, memory device like flash drive, high speed data center communication or a computing equipment such as a tablet computer, a laptop computer or a notebook computer. Rx apparatus 1120 may also be a part of a machine type apparatus, which may be an IoT, NB-IoT, or IIoT apparatus such as an immobile or a stationary apparatus, a home apparatus, a wire communication apparatus or a computing apparatus. For instance, Rx apparatus 1120 may be implemented in a smart thermostat, a smart fridge, a smart door lock, a wireless speaker or a home control center. Alternatively, Rx apparatus 1120 may be implemented in the form of one or more IC chips such as, for example and without limitation, one or more single-core processors, one or more multi-core processors, one or more RISC processors, or one or more CISC) processors. Rx apparatus 1120 may include at least some of those components shown in FIG. 11 such as a processor 1122, for example. Rx apparatus 1120 may further include one or more other components not pertinent to the proposed scheme of the present disclosure (e.g., internal power supply, display device and/or user interface device), and, thus, such component(s) of Rx apparatus 1120 are neither shown in FIG. 11 nor described below in the interest of simplicity and brevity.

It should be noted that, in some implementations, Tx apparatus 1110 may have the functions of Rx apparatus and be operated as a Rx apparatus while Rx apparatus 1120 having the functions of Tx apparatus and being operated as a Tx apparatus.

In one aspect, each of processor 1112 and processor 1122 may be implemented in the form of one or more single-core processors, one or more multi-core processors, or one or more CISC processors. That is, even though a singular term "a processor" is used herein to refer to processor 1112 and processor 1122, each of processor 1112 and processor 1122 may include multiple processors in some implementations and a single processor in other implementations in accordance with the present disclosure. In another aspect, each of processor 1112 and processor 1122 may be implemented in the form of hardware (and, optionally, firmware) with electronic components including, for example and without limitation, one or more transistors, one or more diodes, one or more capacitors, one or more resistors, one or more inductors, one or more memristors and/or one or more varactors that are configured and arranged to achieve specific purposes in accordance with the present disclosure. In other words, in at least some implementations, each of processor 1112 and processor 1122 is a special-purpose machine specifically designed, arranged and configured to perform specific tasks including improvement of LDPC in a apparatus (e.g., as represented by Tx apparatus 1110) and another apparatus (e.g., as represented by Rx apparatus 1120) in accordance with various implementations of the present disclosure.

In some implementations, Tx apparatus 1110 may also include a transceiver 1116 coupled to processor 1112 and capable of wirelessly transmitting and receiving data. In some implementations, Tx apparatus 1110 may further include a memory 1114 coupled to processor 1112 and capable of being accessed by processor 1112 and storing data therein. In some implementations, Rx apparatus 1120 may also include a transceiver 1126 coupled to processor 1122 and capable of wirelessly transmitting and receiving data. In some implementations, Rx apparatus 1120 may further include a memory 1124 coupled to processor 1122 and capable of being accessed by processor 1122 and storing data therein. Accordingly, Tx apparatus 1110 and Rx apparatus 1120 may wirelessly communicate with each other via transceiver 1116 and transceiver 1126, respectively.

In some implementations, a size of the first base matrix and a size of each second base matrix are Z by Z, and a number of the second base matrices is (Z–2).

In some implementations, the first base matrix is $U_1$, the second base matrices are $U_2$ to $U_{Z-1}$, and the operation of determining the second base matrices based on the first base matrix by shifting the plurality of elements of the first base matrix along column-direction or row-direction further includes: determining the second base matrix Ui based on the first base matrix by: (1) shifting the element (0, y) of a first row of the first base matrix $U_1$ to (0, ((y+i−2) % (Z−1))+1), i.e., shifting the element (0, y) to (0, y+1) repeatedly within (0, k), k=2:Z−1, (2) shifting the element (x, 0) of a first column of the first base matrix $U_1$ to (((x+i−2) % (Z−1))+1, 0), i.e., shifting the element (x, 0) to (x+1, 0) repeatedly within (k, 0), k=2:Z−1, and (3) shifting the elements (x, y) of the first base matrix $U_1$ outside the first row and the first column of the first base matrix to ((x+i−1) % (Z−1), (y+i−1) % (Z−1)).

In some implementations, the operation of determining the parity-check matrix according to the first base matrix and the second base matrices further includes: determining an ordered index matrix by the second base matrices $U_2$ to $U_{Z-1}$, wherein the ordered index matrix includes a first parity matrix; determining a mask matrix which has same size of the ordered index matrix, wherein the mask matrix includes a second parity matrix; and determining the parity-check matrix according to the ordered index matrix, the mask matrix and a third parity matrix.

In some implementations, the sizes of the ordered index matrix and the mask matrix are $M_b$ by ($K_b$+4), the sizes of the first parity matrix and the second parity matrix are 4 by 4, and the size of the third parity matrix is ($M_b$−4) by ($M_b$−4).

In some implementations, the $M_b$ by ($K_b$+4) ordered index matrix is:

$$\begin{bmatrix} I(1) & I(2) & I(3) & \ldots & I(K_b-1) & I(K_b) & Z-1 & 1 & 0 & 0 \\ I(1)+1 & I(2)+1 & I(3)+1 & \ldots & I(K_b-1)+1 & I(K_b)+1 & 1 & 1 & 1 & 0 \\ I(1)+2 & I(2)+2 & I(3)+2 & \ldots & I(K_b-1)+2 & I(K_b)+2 & 0 & 0 & 1 & 1 \\ I(1)+3 & I(2)+3 & I(3)+3 & \ldots & I(K_b-1)+3 & I(K_b)+3 & Z-1 & 0 & 0 & 1 \\ I(1)+4 & I(2)+4 & I(3)+4 & \ldots & I(K_b-1)+4 & I(K_b)+4 & I(K_b+1)+4 & I(K_b+2)+4 & I(K_b+3)+4 & I(K_b+4)+4 \\ \ldots & \ldots & \ldots & \ldots & \ldots & \ldots & \ldots & \ldots & \ldots & \ldots \\ I(1)+A & I(2)+A & I(3)+A & \ldots & I(K_b-1)+A & I(K_b)+A & I(K_b+1)+A & I(K_b+2)+A & I(K_b+3)+A & I(K_b+4)+A \end{bmatrix}$$

From Tx or Rx apparatus perspective, in some implementations, processor 1112/1122 may determine a first base matrix corresponding to a parity-check matrix of LDPC code. Processor 1112/1122 may determine a plurality of second base matrices based on the first base matrix by shifting a plurality of elements of the first base matrix along at least one of column-direction and row-direction, wherein a value of each element is one. Processor 1112/1122 may determine the parity-check matrix according to the first base matrix and the second base matrices.

wherein A is ($M_b$−1), and I is an index matching function fulfilled the following condition:

when i is not equal to j, then I(i) is not equal to I(j);
wherein each element m of the ordered index matrix represents corresponding second base matrix $U_m$,
wherein the $M_b$ by ($K_b$+4) mask matrix is:

$$\begin{bmatrix} 1\text{ or }0 & 1\text{ or }0 & 1\text{ or }0 & \ldots & 1\text{ or }0 & 1\text{ or }0 & 0 & 0 & 0 & 0 \\ 1\text{ or }0 & 1\text{ or }0 & 1\text{ or }0 & \ldots & 1\text{ or }0 & 1\text{ or }0 & 0 & 0 & 0 & 0 \\ 1\text{ or }0 & 1\text{ or }0 & 1\text{ or }0 & \ldots & 1\text{ or }0 & 1\text{ or }0 & 0 & 0 & 0 & 0 \\ 1\text{ or }0 & 1\text{ or }0 & 1\text{ or }0 & \ldots & 1\text{ or }0 & 1\text{ or }0 & 0 & 0 & 0 & 0 \\ 1\text{ or }0 & 1\text{ or }0 & 1\text{ or }0 & \ldots & 1\text{ or }0 & 1\text{ or }0 & 1\text{ or }0 & 1\text{ or }0 & 1\text{ or }0 & 1\text{ or }0 \\ 1\text{ or }0 & 1\text{ or }0 & 1\text{ or }0 & \ldots & 1\text{ or }0 & 1\text{ or }0 & 1\text{ or }0 & 1\text{ or }0 & 1\text{ or }0 & 1\text{ or }0 \\ 1\text{ or }0 & 1\text{ or }0 & 1\text{ or }0 & \ldots & 1\text{ or }0 & 1\text{ or }0 & 1\text{ or }0 & 1\text{ or }0 & 1\text{ or }0 & 1\text{ or }0 \\ \ldots & \ldots & \ldots & \ldots & \ldots & \ldots & \ldots & \ldots & \ldots & \ldots \\ 1\text{ or }0 & 1\text{ or }0 & 1\text{ or }0 & \ldots & 1\text{ or }0 & 1\text{ or }0 & 1\text{ or }0 & 1\text{ or }0 & 1\text{ or }0 & 1\text{ or }0 \end{bmatrix}$$

wherein the ($M_b$−4) by ($M_b$−4) third parity matrix is an identity matrix.

In some implementations, the operation of determining the parity-check matrix according to the ordered index matrix, the mask matrix and a third parity matrix further includes: masking the ordered index matrix by the mask matrix; and determining the parity-check matrix by combining the ordered index matrix with the third parity matrix.

In some implementations, an LDPC code length corresponding to the parity-check matrix is $(K_b+M_b-p) \times Z$, an LDPC code rate corresponding to the parity-check matrix is $K_b/(K_b+M_b-p)$ while p is a number of punctured Z.

From Tx apparatus perspective, in some implementations, processor 1112 may encode a message by the parity-check matrix and transmit, via the transceiver 1116, the message to the network node.

From Rx apparatus perspective, in some implementations, processor 1122 may receive, via the transceiver 1126, a message from the network node, and decode the message by the parity-check matrix.

Illustrative Processes

Figure 12:
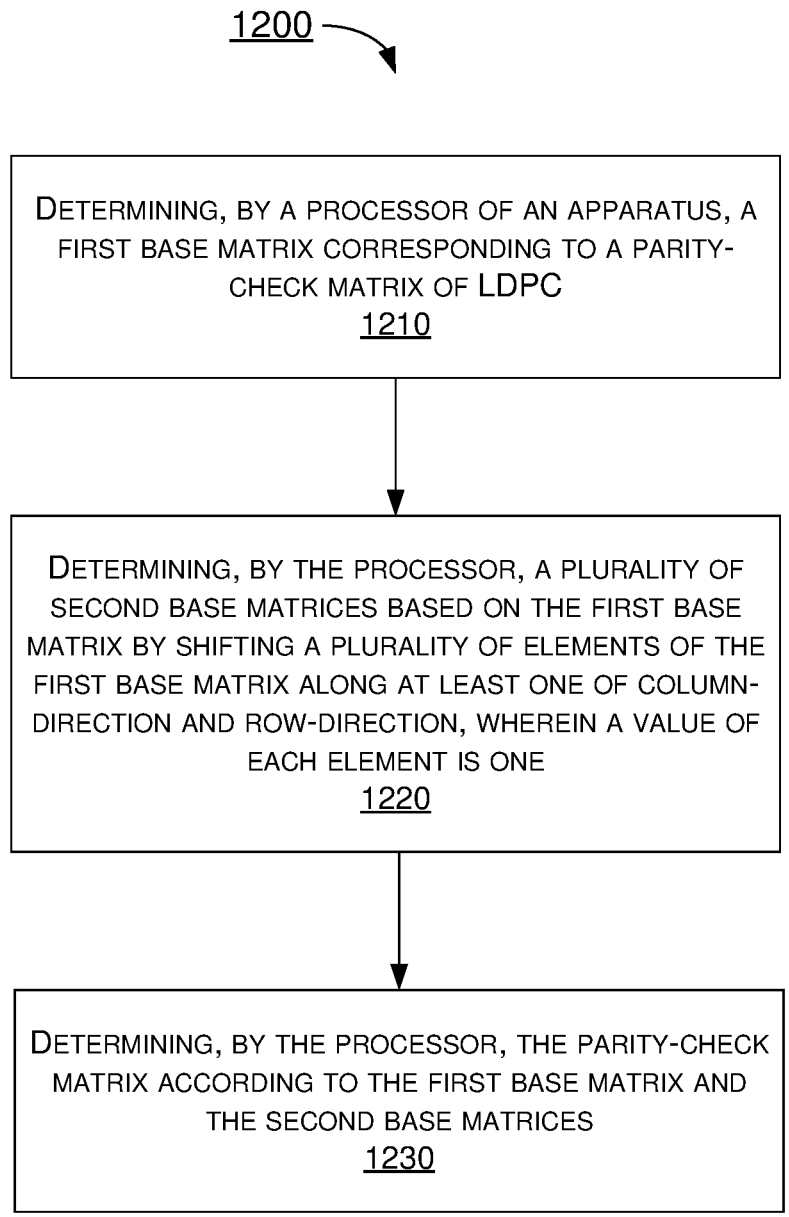
FIG. 12 is a flowchart of an example process in accordance with an implementation of the present disclosure.

FIG. 12 illustrates an example process 1200 in accordance with an implementation of the present disclosure. Process 1200 may be an example implementation of above scenarios/schemes, whether partially or completely, with respect to improvement of LDPC in accordance with the present disclosure. Process 1200 may represent an aspect of implementation of features of Tx apparatus 1110 or Rx apparatus 1120. Process 1200 may include one or more operations, actions, or functions as illustrated by one or more of blocks 1210 to 1230. Although illustrated as discrete blocks, various blocks of process 1200 may be divided into additional blocks, combined into fewer blocks, or eliminated, depending on the desired implementation. Moreover, the blocks of process 1200 may be executed in the order shown in FIG. 12 or, alternatively, in a different order. Process 1200 may be implemented by Tx apparatus 1110, Rx apparatus 1120 or any suitable apparatus or machine type devices. Solely for illustrative purposes and without limitation, process 1200 is described below in the context of Tx apparatus 1110 or Rx apparatus 1120. Process 1200 may begin at block 1210.

At 1210, process 1200 may involve processor 1112/1122 of Tx apparatus 1110/Rx apparatus 1120 determining a first base matrix corresponding to a parity-check matrix of LDPC code. Process 1200 may proceed from 1210 to 1220. At 1220, process 1200 may involve processor 1112/1122 of Tx apparatus 1110/Rx apparatus 1120 determining a plurality of second base matrices based on the first base matrix by shifting a plurality of elements of the first base matrix along at least one of column-direction and row-direction, wherein a value of each element is one. Process 1200 may proceed from 1220 to 1230. At 1230, process 1200 may involve processor 1112/1122 of Tx apparatus 1110/Rx apparatus 1120 determining the parity-check matrix according to the first base matrix and the second base matrices.

In some implementations, a size of the first base matrix and a size of each second base matrix are Z by Z, and a number of the second base matrices is (Z−2).

In some implementations, the first base matrix is $U_1$, the second base matrices are $U_2$ to $U_{Z-1}$. Process 1200 may further involve processor 1112/1122 of Tx apparatus 1110/Rx apparatus 1120 determining the second base matrix $U_i$ based on the first base matrix by: (1) shifting the element (0, y) of a first row of the first base matrix $U_1$ to (0, ((y+i−2) % (Z−1))+1), i.e., shifting the element (0, y) to (0, y+1) repeatedly within (0, k), k=2:Z−1, (2) shifting the element (x, 0) of a first column of the first base matrix $U_1$ to (((x+i−2) % (Z−1))+1, 0), i.e., shifting the element (x, 0) to (x+1, 0) repeatedly within (k, 0), k=2:Z−1, and (3) shifting the elements (x, y) of the first base matrix $U_1$ outside the first row and the first column of the first base matrix to ((x+i−1) % (Z−1), (y+i−1) % (Z−1)).

In some implementations, process 1200 may further involve processor 1112/1122 of Tx apparatus 1110/Rx apparatus 1120 determining an ordered index matrix by the second base matrices $U_2$ to $U_{Z-1}$, wherein the ordered index matrix includes a first parity matrix. Process 1200 may further involve processor 1112/1122 of Tx apparatus 1110/Rx apparatus 1120 determining a mask matrix which has same size of the ordered index matrix, wherein the mask matrix includes a second parity matrix. Process 1200 may further involve processor 1112/1122 of Tx apparatus 1110/Rx apparatus 1120 determining the parity-check matrix according to the ordered index matrix, the mask matrix and a third parity matrix.

In some implementations, the sizes of the ordered index matrix and the mask matrix are $M_b$ by $(K_b+4)$, the sizes of the first parity matrix and the second parity matrix are 4 by 4, and the size of the third parity matrix is $(M_b-4)$ by $(M_b-4)$.

In some implementations, the $M_b$ by $(K_b+4)$ ordered index matrix is:

$$\begin{bmatrix} I(1) & I(2) & I(3) & \ldots & I(K_b-1) & I(K_b) & Z-1 & 1 & 0 & 0 \\ I(1)+1 & I(2)+1 & I(3)+1 & \ldots & I(K_b-1)+1 & I(K_b)+1 & 1 & 1 & 1 & 0 \\ I(1)+2 & I(2)+2 & I(3)+2 & \ldots & I(K_b-1)+2 & I(K_b)+2 & 0 & 0 & 1 & 1 \\ I(1)+3 & I(2)+3 & I(3)+3 & \ldots & I(K_b-1)+3 & I(K_b)+3 & Z-1 & 0 & 0 & 1 \\ I(1)+4 & I(2)+4 & I(3)+4 & \ldots & I(K_b-1)+4 & I(K_b)+4 & I(K_b+1)+4 & I(K_b+2)+4 & I(K_b+3)+4 & I(K_b+4)+4 \\ \ldots & \ldots & \ldots & \ldots & \ldots & \ldots & \ldots & \ldots & \ldots & \ldots \\ I(1)+A & I(2)+A & I(3)+A & \ldots & I(K_b-1)+A & I(K_b)+A & I(K_b+1)+A & I(K_b+2)+A & I(K_b+3)+A & I(K_b+4)+A \end{bmatrix}$$

wherein A is $(M_b-1)$, and I is an index matching function fulfilled the following condition:

when i is not equal to j, then I(i) is not equal to I(j);

wherein each element m of the ordered index matrix represents corresponding second base matrix $U_m$, wherein the $M_b$ by $(K_b+4)$ mask matrix is:

$$\begin{bmatrix} 1 \text{ or } 0 & 1 \text{ or } 0 & 1 \text{ or } 0 & \ldots & 1 \text{ or } 0 & 1 \text{ or } 0 & 0 & 0 & 0 & 0 \\ 1 \text{ or } 0 & 1 \text{ or } 0 & 1 \text{ or } 0 & \ldots & 1 \text{ or } 0 & 1 \text{ or } 0 & 0 & 0 & 0 & 0 \\ 1 \text{ or } 0 & 1 \text{ or } 0 & 1 \text{ or } 0 & \ldots & 1 \text{ or } 0 & 1 \text{ or } 0 & 0 & 0 & 0 & 0 \\ 1 \text{ or } 0 & 1 \text{ or } 0 & 1 \text{ or } 0 & \ldots & 1 \text{ or } 0 & 1 \text{ or } 0 & 0 & 0 & 0 & 0 \\ 1 \text{ or } 0 & 1 \text{ or } 0 & 1 \text{ or } 0 & \ldots & 1 \text{ or } 0 & 1 \text{ or } 0 & 1 \text{ or } 0 & 1 \text{ or } 0 & 1 \text{ or } 0 & 1 \text{ or } 0 \\ 1 \text{ or } 0 & 1 \text{ or } 0 & 1 \text{ or } 0 & \ldots & 1 \text{ or } 0 & 1 \text{ or } 0 & 1 \text{ or } 0 & 1 \text{ or } 0 & 1 \text{ or } 0 & 1 \text{ or } 0 \\ 1 \text{ or } 0 & 1 \text{ or } 0 & 1 \text{ or } 0 & \ldots & 1 \text{ or } 0 & 1 \text{ or } 0 & 1 \text{ or } 0 & 1 \text{ or } 0 & 1 \text{ or } 0 & 1 \text{ or } 0 \\ \ldots & \ldots & \ldots & \ldots & \ldots & \ldots & \ldots & \ldots & \ldots & \ldots \\ 1 \text{ or } 0 & 1 \text{ or } 0 & 1 \text{ or } 0 & \ldots & 1 \text{ or } 0 & 1 \text{ or } 0 & 1 \text{ or } 0 & 1 \text{ or } 0 & 1 \text{ or } 0 & 1 \text{ or } 0 \end{bmatrix}$$

wherein the $(M_b-4)$ by $(M_b-4)$ third parity matrix is an identity matrix.

In some implementations, process 1200 may further involve processor 1112/1122 of Tx apparatus 1110/Rx apparatus 1120 masking the ordered index matrix by the mask matrix. Process 1200 may further involve processor 1112/1122 of Tx apparatus 1110/Rx apparatus 1120 determining the parity-check matrix by combining the ordered index matrix with the third parity matrix.

In some implementations, an LDPC code length corresponding to the parity-check matrix is $(K_b+M_b-p) \times Z$, an LDPC code rate corresponding to the parity-check matrix is $K_b/(K_b+M_b-p)$ while p is a number of punctured Z.

In some implementations, process 1200 may further involve processor 1112 of Tx apparatus 1110 encoding a message by the parity-check matrix. Process 1200 may further involve processor 1112 of Tx apparatus 1110 transmitting the message to a network.

In some implementations, process 1200 may further involve processor 1122 of Rx apparatus 1120 receiving a message from a network. Process 1200 may further involve processor 1122 of Rx apparatus 1120 decoding the message by the parity-check matrix.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A method, comprising:
   determining, by a processor of an apparatus, a first base matrix corresponding to a parity-check matrix of Low-Density Parity-Check (LDPC) code;
   determining, by the processor, a plurality of second base matrices based on the first base matrix by shifting elements of a first row of the first base matrix along row-direction, shifting elements of a first column of the first base matrix along column-direction, and shifting elements outside the first row and the first column of the first base matrix along both column-direction and row-direction, wherein a value of each element is one;
   determining, by the processor, the parity-check matrix according to the first base matrix and the second base matrices; and
   transceiving, by the processor, a message, which is encoded by the parity-check matrix, with a network node.

2. The method of claim 1, wherein a size of the first base matrix and a size of each second base matrix are Z by Z, and a number of the second base matrices is (Z–2).

$$\begin{bmatrix} I(1) & I(2) & I(3) & \ldots & I(K_b-1) & I(K_b) & Z-1 & 1 & 0 & 0 \\ I(1)+1 & I(2)+1 & I(3)+1 & \ldots & I(K_b-1)+1 & I(K_b)+1 & 1 & 1 & 1 & 0 \\ I(1)+2 & I(2)+2 & I(3)+2 & \ldots & I(K_b-1)+2 & I(K_b)+2 & 0 & 0 & 1 & 1 \\ I(1)+3 & I(2)+3 & I(3)+3 & \ldots & I(K_b-1)+3 & I(K_b)+3 & Z-1 & 0 & 0 & 1 \\ I(1)+4 & I(2)+4 & I(3)+4 & \ldots & I(K_b-1)+4 & I(K_b)+4 & I(K_b+1)+4 & I(K_b+2)+4 & I(K_b+3)+4 & I(K_b+4)+4 \\ \ldots & \ldots & \ldots & \ldots & \ldots & \ldots & \ldots & \ldots & \ldots & \ldots \\ I(1)+A & I(2)+A & I(3)+A & \ldots & I(K_b-1)+A & I(K_b)+A & I(K_b+1)+A & I(K_b+2)+A & I(K_b+3)+A & I(K_b+4)+A \end{bmatrix}$$

3. The method of claim 2, wherein the first base matrix is $U_1$, the second base matrices are $U_2$ to $U_{Z-1}$, and the step of determining the second base matrices based on the first base matrix by shifting the plurality of elements of the first base matrix along column-direction or row-direction further comprises:

determining, by the processor, the second base matrix $U_i$ based on the first base matrix by:
   shifting the element (0, y) of the first row of the first base matrix $U_1$ to (0, ((y+i–2) % (Z–1))+1), i.e., shifting the element (0, y) to (0, y+1) repeatedly within (0, k), k=2:Z–1,
   shifting the element (x, 0) of the first column of the first base matrix $U_1$ to (((x+i–2) % (Z–1))+1, 0), i.e., shifting the element (x, 0) to (x+1, 0) repeatedly within (k, 0), k=2:Z–1, and
   shifting the elements (x, y) of the first base matrix $U_1$ outside the first row and the first column of the first base matrix to ((x+i–1) % (Z–1), (y+i–1) % (Z–1)).

4. The method of claim 3, wherein the step of determining the parity-check matrix according to the first base matrix and the second base matrices further comprises:
   determining, by the processor, an ordered index matrix by the second base matrices $U_2$ to $U_{Z-1}$, wherein the ordered index matrix includes a first parity matrix;
   determining, by the processor, a mask matrix which has same size of the ordered index matrix, wherein the mask matrix includes a second parity matrix; and
   determining, by the processor, the parity-check matrix according to the ordered index matrix, the mask matrix and a third parity matrix.

5. The method of claim 4, wherein the sizes of the ordered index matrix and the mask matrix are $M_b$ by $(K_b+4)$, the sizes of the first parity matrix and the second parity matrix are 4 by 4, and the size of the third parity matrix is $(M_b-4)$ by $(M_b-4)$, $M_b$ represents a number of rows of the parity-check matrix, and $M_b+K_b$ represents a number of columns of the parity-check matrix.

6. The method of claim 5, wherein the $M_b$ by $(K_b+4)$ ordered index matrix is:

wherein A is $(M_b-1)$, and I is an index matching function fulfilled the following conditions:
   when i is not equal to j, then I(i) is not equal to I(j);
wherein each element m of the ordered index matrix represents corresponding second base matrix $U_m$,
wherein the $M_b$ by $(K_b+4)$ mask matrix is:

$$\begin{bmatrix} 1 \text{ or } 0 & 1 \text{ or } 0 & 1 \text{ or } 0 & \ldots & 1 \text{ or } 0 & 1 \text{ or } 0 & 0 & 0 & 0 & 0 \\ 1 \text{ or } 0 & 1 \text{ or } 0 & 1 \text{ or } 0 & \ldots & 1 \text{ or } 0 & 1 \text{ or } 0 & 0 & 0 & 0 & 0 \\ 1 \text{ or } 0 & 1 \text{ or } 0 & 1 \text{ or } 0 & \ldots & 1 \text{ or } 0 & 1 \text{ or } 0 & 0 & 0 & 0 & 0 \\ 1 \text{ or } 0 & 1 \text{ or } 0 & 1 \text{ or } 0 & \ldots & 1 \text{ or } 0 & 1 \text{ or } 0 & 0 & 0 & 0 & 0 \\ 1 \text{ or } 0 & 1 \text{ or } 0 & 1 \text{ or } 0 & \ldots & 1 \text{ or } 0 & 1 \text{ or } 0 & 1 \text{ or } 0 & 1 \text{ or } 0 & 1 \text{ or } 0 & 1 \text{ or } 0 \\ 1 \text{ or } 0 & 1 \text{ or } 0 & 1 \text{ or } 0 & \ldots & 1 \text{ or } 0 & 1 \text{ or } 0 & 1 \text{ or } 0 & 1 \text{ or } 0 & 1 \text{ or } 0 & 1 \text{ or } 0 \\ 1 \text{ or } 0 & 1 \text{ or } 0 & 1 \text{ or } 0 & \ldots & 1 \text{ or } 0 & 1 \text{ or } 0 & 1 \text{ or } 0 & 1 \text{ or } 0 & 1 \text{ or } 0 & 1 \text{ or } 0 \\ \ldots & \ldots & \ldots & \ldots & \ldots & \ldots & \ldots & \ldots & \ldots & \ldots \\ 1 \text{ or } 0 & 1 \text{ or } 0 & 1 \text{ or } 0 & \ldots & 1 \text{ or } 0 & 1 \text{ or } 0 & 1 \text{ or } 0 & 1 \text{ or } 0 & 1 \text{ or } 0 & 1 \text{ or } 0 \end{bmatrix}$$

wherein the $(M_b-4)$ by $(M_b-4)$ third parity matrix is an identity matrix.

7. The method of claim 6, wherein the step of determining the parity-check matrix according to the ordered index matrix, the mask matrix and a third parity matrix further includes:
   masking, by the processor, the ordered index matrix by the mask matrix; and determining, by the processor, the parity-check matrix by combining the ordered index matrix with the third parity matrix.

8. The method of claim 7, wherein an LDPC code length corresponding to the parity-check matrix is $(K_b+M_b-p)\times Z$, an LDPC code rate corresponding to the parity-check matrix is $K_b/(K_b+M_b-p)$ while p denotes a number of punctured Z-sized blocks not transmitted in the LDPC code.

9. The method of claim 1, further comprising:
encoding, by the processor, the message by the parity-check matrix; and
transmitting, by the processor, the message to the network node.

10. The method of claim 1, further comprising:
receiving, by the processor, the message from the network node; and
decoding, by the processor, the message by the parity-check matrix.

11. An apparatus, comprising:
a transceiver which, during operation, wirelessly communicates with a network node; and
a processor communicatively coupled to the transceiver such that, during operation, the processor performs operations comprising:
determining a first base matrix corresponding to a parity-check matrix of Low-Density Parity-Check (LDPC) code;
determining a plurality of second base matrices based on the first base matrix by shifting elements of a first row of the first base matrix along row-direction, shifting elements of a first column of the first base matrix along column-direction, and shifting elements outside the first row and the first column of the first base matrix along both column-direction and row-direction, wherein a value of each element is one;
determining the parity-check matrix according to the first base matrix and the second base matrices; and
transceiving, via the transceiver, a message, which is encoded by the parity-check matrix, with the network node.

12. The apparatus of claim 11, wherein a size of the first base matrix and a size of each second base matrix are Z by Z, and a number of the second base matrices is (Z−2).

13. The apparatus of claim 12, wherein the first base matrix is $U_1$, the second base matrices are $U_2$ to $U_{Z-1}$, and the operation of determining the second base matrices based on the first base matrix by shifting the plurality of elements of the first base matrix along column-direction or row-direction further comprises:

determining the second base matrix $U_i$ based on the first base matrix by:

shifting the element (0, y) of the first row of the first base matrix $U_1$ to (0, ((y+i−2) % (Z−1))+1), i.e., shifting the element (0, y) to (0, y+1) repeatedly within (0, k), k=2:Z−1, shifting the element (x, 0) of the first column of the first base matrix $U_1$ to (((x+i−2) % (Z−1))+1, 0), i.e., shifting the element (x, 0) to (x+1, 0) repeatedly within (k, 0), k=2:Z−1, and shifting the elements (x, y) of the first base matrix $U_1$ outside the first row and the first column of the first base matrix to ((x+i−1) % (Z−1), (y+i−1) % (Z−1)).

14. The apparatus of claim 13, wherein the operation of determining the parity-check matrix according to the first base matrix and the second base matrices further comprises:

determining an ordered index matrix by the second base matrices $U_2$ to $U_{Z-1}$, wherein the ordered index matrix includes a first parity matrix;

determining a mask matrix which has same size of the ordered index matrix, wherein the mask matrix includes a second parity matrix; and determining the parity-check matrix according to the ordered index matrix, the mask matrix and a third parity matrix.

15. The apparatus of claim 14, wherein the sizes of the ordered index matrix and the mask matrix are $M_b$ by $(K_b+4)$, the sizes of the first parity matrix and the second parity matrix are 4 by 4, and the size of the third parity matrix is $(M_b-4)$ by $(M_b-4)$, $M_b$ represents a number of rows of the parity-check matrix, and $M_b+K_b$ represents a number of columns of the parity-check matrix.

16. The apparatus of claim 15, wherein the $M_b$ by $(K_b+4)$ ordered index matrix is:

$$\begin{bmatrix} I(1) & I(2) & I(3) & \ldots & I(K_b-1) & I(K_b) & Z-1 & 1 & 0 & 0 \\ I(1)+1 & I(2)+1 & I(3)+1 & \ldots & I(K_b-1)+1 & I(K_b)+1 & 1 & 1 & 1 & 0 \\ I(1)+2 & I(2)+2 & I(3)+2 & \ldots & I(K_b-1)+2 & I(K_b)+2 & 0 & 0 & 1 & 1 \\ I(1)+3 & I(2)+3 & I(3)+3 & \ldots & I(K_b-1)+3 & I(K_b)+3 & Z-1 & 0 & 0 & 1 \\ I(1)+4 & I(2)+4 & I(3)+4 & \ldots & I(K_b-1)+4 & I(K_b)+4 & I(K_b+1)+4 & I(K_b+2)+4 & I(K_b+3)+4 & I(K_b+4)+4 \\ \ldots & \ldots & \ldots & \ldots & \ldots & \ldots & \ldots & \ldots & \ldots & \ldots \\ I(1)+A & I(2)+A & I(3)+A & \ldots & I(K_b-1)+A & I(K_b)+A & I(K_b+1)+A & I(K_b+2)+A & I(K_b+3)+A & I(K_b+4)+A \end{bmatrix}$$

wherein A is $(M_b-1)$, and I is an index matching function fulfilled the following condition:
when i is not equal to j, then I(i) is not equal to I(j);
wherein each element m of the ordered index matrix represents corresponding second base matrix $U_m$, wherein the $M_b$ by $(K_b+4)$ mask matrix is:

$$\begin{bmatrix} 1\text{ or }0 & 1\text{ or }0 & 1\text{ or }0 & \ldots & 1\text{ or }0 & 1\text{ or }0 & 0 & 0 & 0 & 0 \\ 1\text{ or }0 & 1\text{ or }0 & 1\text{ or }0 & \ldots & 1\text{ or }0 & 1\text{ or }0 & 0 & 0 & 0 & 0 \\ 1\text{ or }0 & 1\text{ or }0 & 1\text{ or }0 & \ldots & 1\text{ or }0 & 1\text{ or }0 & 0 & 0 & 0 & 0 \\ 1\text{ or }0 & 1\text{ or }0 & 1\text{ or }0 & \ldots & 1\text{ or }0 & 1\text{ or }0 & 0 & 0 & 0 & 0 \\ 1\text{ or }0 & 1\text{ or }0 & 1\text{ or }0 & \ldots & 1\text{ or }0 & 1\text{ or }0 & 1\text{ or }0 & 1\text{ or }0 & 1\text{ or }0 & 1\text{ or }0 \\ 1\text{ or }0 & 1\text{ or }0 & 1\text{ or }0 & \ldots & 1\text{ or }0 & 1\text{ or }0 & 1\text{ or }0 & 1\text{ or }0 & 1\text{ or }0 & 1\text{ or }0 \\ 1\text{ or }0 & 1\text{ or }0 & 1\text{ or }0 & \ldots & 1\text{ or }0 & 1\text{ or }0 & 1\text{ or }0 & 1\text{ or }0 & 1\text{ or }0 & 1\text{ or }0 \\ \ldots & \ldots & \ldots & \ldots & \ldots & \ldots & \ldots & \ldots & \ldots & \ldots \\ 1\text{ or }0 & 1\text{ or }0 & 1\text{ or }0 & \ldots & 1\text{ or }0 & 1\text{ or }0 & 1\text{ or }0 & 1\text{ or }0 & 1\text{ or }0 & 1\text{ or }0 \end{bmatrix}$$

wherein the $(M_b-4)$ by $(M_b-4)$ third parity matrix is an identity matrix.

17. The apparatus of claim 16, wherein the operation of determining the parity-check matrix according to the ordered index matrix, the mask matrix and a third parity matrix further includes:
   masking the ordered index matrix by the mask matrix; and
   determining the parity-check matrix by combining the ordered index matrix with the third parity matrix.

18. The apparatus of claim 17, wherein an LDPC code length corresponding to the parity-check matrix is $(K_b+M_b-p) \times Z$, an LDPC code rate corresponding to the parity-check matrix is $K_b/(K_b+M_b-p)$ while p denotes a number of punctured Z-sized blocks not transmitted in the LDPC code.

19. The apparatus of claim 11, wherein, during operation, the processor further performs operations comprising:
   encoding the message by the parity-check matrix; and
   transmitting, via the transceiver, the message to the network node.

20. The apparatus of claim 11, wherein, during operation, the processor further performs operations comprising:
   receiving, via the transceiver, the message from the network node; and
   decoding the message by the parity-check matrix.

* * * * *